United States Patent [19]

Griffith

[11] Patent Number: 4,786,608

[45] Date of Patent: Nov. 22, 1988

[54] TECHNIQUE FOR FORMING ELECTRIC FIELD SHIELDING LAYER IN OXYGEN-IMPLANTED SILICON SUBSTRATE

[75] Inventor: Richard W. Griffith, Satellite Beach, Fla.

[73] Assignee: Harris Corp., Melbourne, Fla.

[21] Appl. No.: 947,749

[22] Filed: Dec. 30, 1986

[51] Int. Cl.$^4$ .................... H01L 21/265; H01L 21/20
[52] U.S. Cl. ........................ 437/24; 437/21; 437/26; 437/247
[58] Field of Search ...................... 437/24, 26, 249, 21

[56] References Cited

U.S. PATENT DOCUMENTS

| | | | |
|---|---|---|---|
| 4,385,937 | 5/1980 | Ohmura | 437/24 |
| 4,412,868 | 11/1983 | Brown et al. | 437/24 |
| 4,463,492 | 8/1984 | Maeguchi | 437/24 |
| 4,515,642 | 5/1985 | Ajima et al. | 437/24 |
| 4,676,841 | 6/1987 | Celler | 437/24 |

FOREIGN PATENT DOCUMENTS

| | | | |
|---|---|---|---|
| 0042552 | 12/1981 | European Pat. Off. | |
| 0016586 | 2/1978 | Japan | 357/23 CS |
| WO85/00694 | 2/1985 | PCT Int'l Appl. | |

OTHER PUBLICATIONS

Tuppen et al., Thin Solid Films, 13 (1985) 233.
Mao et al., Appl. Phys. Lett., 48 (1986) 794.
Nakashima et al., IEEE Trans. Electron Devices, Ed. 33, (Jun. 1986) 126.
Tuppen et al., Appl. Phys. Lett., 45 (1984) 57.
Davis et al., Appl. Phys. Letts., 48 (1986) 1279.

*Primary Examiner*—Upendra Roy
*Attorney, Agent, or Firm*—Antonelli, Terry & Wands

[57] ABSTRACT

A process for forming an electric field shielding layer in a SIMOX substrate entails carrying out a high beam-current oxygen implant over a manufacturing-acceptable period of time, which increases the wafer temperature (on the order of 500° C.) causing in situ annealing of the substrate and suppresses the initial formation of an EFS layer. After the oxygen implant step and prior to subsequent annealing, however, the oxygen implanted silicon substrate is subjected to a medium dose silicon implantation ($10^{15}$–$10^{16}$ Si+ cm$^{-2}$) with projected ion range near the interface of the silicon-on-insulator film and the buried oxide layer. This high-throughput implantation can be carried out at or near room temperature in only several minutes and effectively creates an oxygen-doped amorphous silicon precursor EFS layer atop the buried dielectric layer, while leaving the overlying surface silicon layer relatively undamaged. Subsequent annealing of the dual oxygen-/silicon-implanted substrate at a temperature on the order of 1,150° C.–1,250° C. then leads to the formation of an oxygen-doped polycrystalline EFS layer atop the buried dielectric silicon dioxide layer and separated from the top device-quality crystalline silicon film by a thin interfacial oxide layer. Thus, this technique results in a high-volume front-end microelectronics process for producing SIMOX wafers that incorporate an EFS layer tailored by an intermediate self-implant amorphization step.

17 Claims, 2 Drawing Sheets

TECHNIQUE FOR FORMING ELECTRIC FIELD SHIELDING LAYER IN OXYGEN-IMPLANTED SILICON SUBSTRATE

FIELD OF THE INVENTION

The present invention relates in general to the manufacture of semiconductor devices and circuits and is particularly directed to a new and improved methodology for forming an electric field shielding layer in an oxygen implanted silicon substrate.

BACKGROUND OF THE INVENTION

Because of its excellent electrical isolation properties and because of the ease of oxidizing silicon, a dielectric isolation tub of silicon dioxide is a commonly employed mechanism for isolating one integrated circuit island from another. Typically, a dielectrically isolated integrated circuit architecture will comprise a support substrate ("wafer handle") of thick deposited polycrystalline silicon atop which is disposed a silicon layer in which the active devices of the integrated circuit are formed. The respective devices are isolated from one another by tubs of dielectric material (e.g. silicon dioxide) which surround the devices and isolate the devices from adjacent silicon. Often the dielectric isolation tubs are formed by extending a silicon dioxide ring (formed by thermal oxidation or dielectrically refilled trench) down through the silicon to an underlying layer of silicon dioxide, so that each device is dielectrically isolated at the bottom thereof by the underlying silicon dioxide layer and on the sides thereof by the surrounding silicon dioxide ring.

One processing methodology for forming such a dielectric isolated integrated circuit structure, known by the acronym SIMOX, involves the separation of an upper, thin (1,000 Å-3,000 Å) portion of a monocrystalline silicon substrate, wherein devices are to be formed, from the lower portion of the substrate by implanting oxygen ions (typical implant dose $1.0 \times 10^{18}$ to $2.4 \times 10^{18}$ $O^+cm^{-2}$) into the substrate to form a buried (separated) dielectric layer (typical thickness 1,600 Å-5,000 Å). In the course of this Separation by IMplanted OXygen (SIMOX) process, the thin upper portion of the substrate in which circuit devices are to be formed accumulates damage by the passage of the oxygen ions therethrough to that buried portion of the substrate whereat the (dielectric) silicon dioxide layer is formed. As a result, the substrate must be annealed (usually at a temperature in a range of 1,150° C. to 1,275° C.) to heal damage in the thin silicon layer.

In a recently published article by Nakashima et al, entitled "High-Voltage CMOS SIMOX Technology and Its Application to a BSH-LSI", IEEE Transactions on Electron Devices, Vol. ED-33, No. 1, ppg. 126, Jan. 1986, it has been reported that, depending upon the conditions of the oxygen implantation step, the subsequent annealing step may cause the formation of an electric field shielding (EFS) layer of oxygen-doped polycrystalline silicon having a thickness on the order of several hundred angstroms between the buried silicon dioxide layer and the thin crystalline surface silicon layer. In particular, SIMOX substrates receiving an oxygen-implant dose in the above range (e.g. $1.8 \times 10^{18}$ $O^+cm^{-2}$) have been found to exhibit an EFS layer after the annealing at 1,150° C. for two hours in a nitrogen atmosphere, when ion implantation beam current density is restricted to a range on the order of 12.5 to 17.5 μA cm$^{-2}$ (when using an Extrion 200-20A implanter with standard wafer holders).

Contiguous with the top of the thin EFS polycrystalline layer is a thin (several hundred Å) interfacial layer of silicon dioxide that isolates the surface monocrystalline silicon from the active polycrystalline EFS layer. Depending upon the anneal temperature, oxide precipitates may also be present above the polycrystalline EFS layer. Because of the presence of the EFS layer, when a back-surface voltage is applied to the substrate, the density of localized states in the polysilicon band gap effectively "shields", or terminates, the electric field lines arising from the substrate back-gate. Consequently, devices formed in the annealed crystalline silicon surface layer are vertically isolated from variations in substrate potential by the EFS layer, while the buried oxide layer continues to prevent leakage current between the top silicon layer and the underlying support substrate.

Now although the formation of such an EFS layer constitutes a marked improvement over conventional buried dielectric architectures, the conventional processing methodology employed to form such a layer suffers from a number of drawbacks that make it less practical from a manufacturing standpoint.

More particularly, the dose rate of the oxygen implant to create the requisite amorphous layer from which the oxygen doped polycrystalline silicon EFS layer will be formed during the subsequent annealing step is not compatible with a reasonably short implant time (on the order of several hours) using present day ion implantation equipment that lacks controllable, uniform active cooling. Therefore, high wafer throughput is not achieved. Indeed, the implantation of a high dose (of order $2 \times 10^{18}$ $O^+cm^{-2}$) of oxygen ions over a period of only several hours would require excessively high beam currents, i.e. a high dose rate, resulting in a wafer temperature in excess of 400° C. (and typically in the neighborhood of 500°-600° C). Such a wafer temperature effectively imparts an in situ annealing of the substrate during oxygen implantation, which prevents the formation of an amorphous layer, which is a precursor to the EFS layer at the buried oxide interface. Consequently, the beam current must be reduced in order to keep the substrate temperature low, thereby necessitating a substantial increase in the time required to accomplish the implantation (a time period typically on the order of 8 to 16 hours). In other words, although the formation of an EFS layer contiguous with a buried oxide layer in a dielectrically isolated integrated circuit structure is electronically advantageous, when contrasted with nonshielded structures, the time required to manufacture such a structure using the processing methodology described in the above-referenced literature practically negates introduction of the architecture into the high-volume integrated circuit marketplace.

SUMMARY OF THE INVENTION

Pursuant to the present invention, the above-discussed drawbacks of the conventional time consuming process of forming a SIMOX substrate with EFS layer is obviated by a methodology that not only significantly reduces manufacturing time, but is expected to permit tailoring of the characteristics of the EFS layer. Pursuant to the present invention, rather than implant the oxygen ions at a low dose rate over a long period of time to avoid the inherent in situ annealing which prevents the formation of the amorphous layer that acts as the precursor to the EFS layer, the present invention carries out a high current oxygen implant over a manufacturing-acceptable period of time, which increases the wafer temperature during implant to the order of 500° C. and higher (thereby preventing the formation of an amorphous "precursor" EFS layer). After the oxygen implant step and prior to annealing, however, the oxygen implanted silicon substrate is subjected to a medium dosage silicon implantation ($10^{15}$–$10^{16}$ Si+cm$^{-2}$) near the upper interface of the buried oxide layer. This "self implant" can be carried out at or near room temperature for only several minutes and effectively creates an oxygen-doped amorphous silicon precursor EFS layer atop the buried dielectric layer, while leaving the overlying surface silicon layer relatively undamaged. Subsequent annealing of the dual oxygen/silicon-implanted substrate at a temperature on the order of 1,150° C.–1,250° C., as in the conventional annealing process, causes the formation of the desired oxygen-doped polycrystalline EFS layer atop the buried dielectric silicon dioxide layer, separated from the top crystalline silicon film by a thin interfacial oxide layer.

Contrasted with the conventional SIMOX process in which oxygen is implanted at a low dose rate over an extremely long period of time (e.g. on the order of 8 to 16 hours) in order to create the requisite amorphous precursor layer (and thereby is an impractical manufacturing technique), the present invention employs a high dose rate implant of oxygen ions over a reasonably short period of time (3–4 hours) to supply the requisite oxygen for formation of the buried layer and the oxygen-doped polycrystalline silicon layer, followed by several minutes of a low (room-) temperature silicon ion implant, to create the necessary amorphous precursor region from which the polycrystalline layer may be formed during subsequent annealing.

By substantially reducing the time required for carrying out the full SIMOX process, the present invention offers a practical, and thereby manufacture-attractive, technique for obtaining a dielectric-isolated integrated circuit structure having the desired EFS layer. Moreover, because the dose of the silicon implantation step is relatively low (three orders of magnitude less than that employed in the oxygen implantation step) extremely precise control over the electrical and metallurgical characteristics of the EFS precursor layer, and thereby the EFS layer itself, provides a further figure of merit for the processing methodology of the invention.

DETAILED DESCRIPTION

Figure 1:
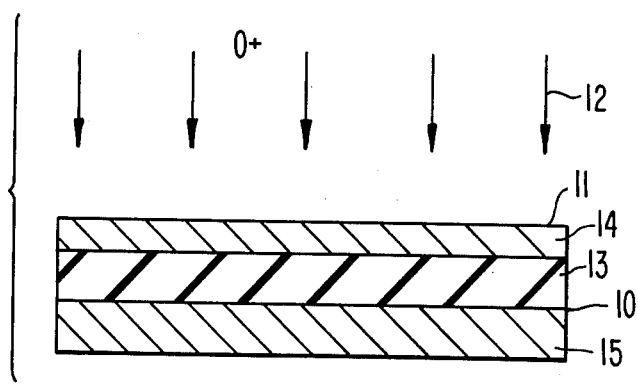
FIGS. 1–3 are respective diagrammatic views of a cross-section of a SIMOX substrate at respective stages of implantation and annealing for illustrating the formation of a buried dielectric and electric field shielding layer.

Referring now to FIG. 1, the first step in the improved SIMOX processing methodology of the present invention comprises exposing a top planar surface 11 of a semiconductor substrate 10 to an oxygen ion beam 12 for the purpose of forming a buried oxide layer 13. In the eventually completed device, buried oxide layer 13 serves to dielectrically isolate a thin upper monocrystalline silicon layer 14 from a lower support substrate layer 15 therebeneath. For purposes of providing an illustrated example, starting substrate 10 may comprise a (100) 3-5 ohm-cm N-type 100-millimeter-diameter silicon wafer having an overlying thermally grown 25-nm screen oxide formed on surface 11. The substrate is then irradiated with a high dose rate oxygen ion implantation beam to form an oxygen ion-implanted silicon dioxide dielectric layer 13 at an oxygen dosage greater than $1.0 \times 10^{18}$O+cm$^{-2}$ (for example, in a range of $1.6 \times 10^{18}$–$2.4 \times 10^{18}$O+cm$^{-2}$).

For this purpose, a high-current "batch" implanter with wafer scanning may be employed that operates at 150 keV–200 keV with a beam current density corresponding to a wafer temperature in excess of 400° C. This beam current density (dose rate) is maintained for a period of several hours, resulting in the formation of buried silicon dioxide layer 13 having an oxygen implant dosage in the above range of $1.6 \times 10^{18}$–$2.4 \times 10^{18}$O+cm$^{-2}$, and a thickness on the order of 3–5 k Å, buried beneath surface 11 of substrate 10 and separated from the surface 11 by approximately 1000 Å–3000 Å. Because of the high current density of the implant beam, the temperature of the substrate is increased dramatically to a temperature range exceeding 400° C. (and typically on the order of 500°–600° C.).

Figure 2:
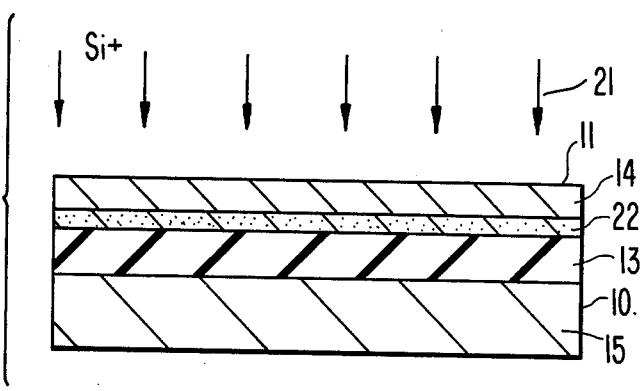

Next, the as-implanted SIMOX wafers undergo a silicon implantation using any appropriate medium-current production implanter (e.g. Eaton NOVA 3206) with fast throughput cassette-to-cassette capability. As illustrated in FIG. 2, the SIMOX substrate is irradiated with a silicon ion beam 21 using, for example, a single non-channeling Si+implant at an implant energy of approximately 120–140 keV for 1700 Å silicon-on-insulator film thickness (implant beam is at a 7° angle of incidence from the normal to the substrate surface 11). The silicon ion implant produces an amorphous oxygen-doped precursor layer 22 for a dose of silicon ions on the order $0.5$–$2 \times 10^{15}$Si+cm$^{-2}$(cooled wafer case) with a projected ion range approximately equal to the depth of the interface between implanted oxide layer 13 and thin silicon layer 14. Specifically, the implanted silicon ions effectively damage the oxygen doped crystal lattice in the interfacial region of the upper silicon layer 14 contiguous with the implanted oxide layer 13 to form an amorphous silicon precursor layer 22 (having a thickness determined by the projected straggle) between the monocrystalline silicon material of layer 14 and the implanted oxide material of layer 13. During this step, the silicon dose rate may be on the order of $3.3 \times 10^{12}$ to $9.0 \times 10^{12}$Si+/cm$^2$-s for a period of approximately 1–5 minutes for a room temperature ("cooled wafer") self-implantation.

Following the formation of the oxygen-doped amorphous silicon precursor layer 22, the substrate is annealed. In accordance with a preferred embodiment of the invention, the annealing step is carried out at a temperature in a range of 1,150°–1,250° C. for a period of approximately 3 hours. During this conventional annealing step, the oxygen-doped amorphous precursor layer 22 is converted into the desired electric field shielding polysilicon layer 32, as shown in FIG. 3, while a thin interfacial silicon dioxide layer 33 having a thickness on the order of several 10 nm is formed between the polysilicon EFS layer 32 and the annealed top surface crystalline silicon layer 14.

After the annealing step, the SIMOX substrate with incorporated EFS layer is processed in a conventional fashion to form devices and circuits in monocrystalline surface layer 14. If desired, epitaxial deposition of silicon by chemical vapor deposition can build up the overall thickness of the silicon-on-insulator film prior to device fabrication.

Figure 3:
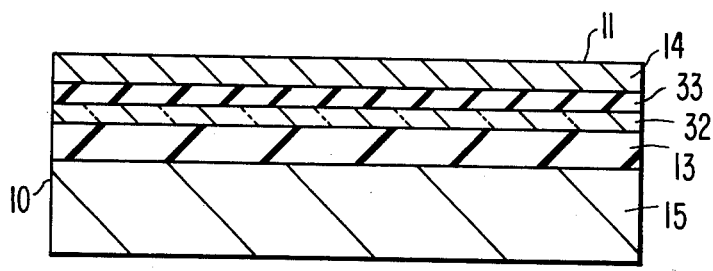
Figure 4:
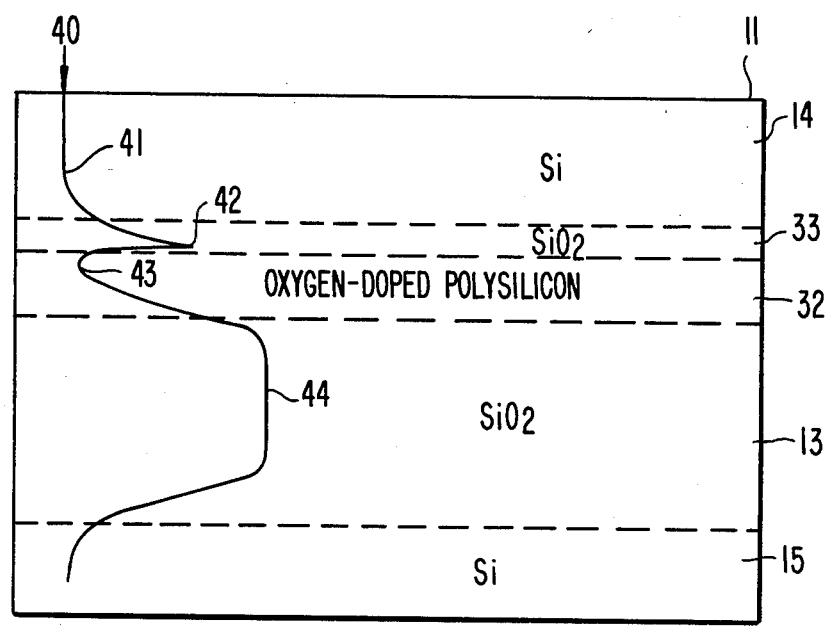
FIG. 4 is a graphical illustration of the variation in oxygen concentration measured at various locations in the SIMOX substrate upon completion of the processing steps shown in FIGS. 1–3.

FIG. 4 shows the relationship between oxygen concentration and depth from surface 11 of the substrate 10 in the completed SIMOX device processed in accordance with the dual high-dose oxygen implant and medium-dose silicon implant sequence shown in FIGS. 1–3. As shown in FIG. 4, the oxygen concentration curve 40 has a relatively low value over portion 41 within the annealed monocrystalline silicon layer 14 which increases to a small peak 42 in thin silicon dioxide region 33 and drops off again to a valley 43 within the electric field shielding layer 32 before increasing over portion 44 within underlying stoichiometric buried oxide layer 13. Curve 40 effectively corresponds to the measured oxygen concentration distribution of the SIMOX structure incorporating an EFS layer described in the above-referenced article of Nakashima et al. Advantageously, however, the processing methodology of the present invention is a very practical process from a manufacturing standpoint, in that the time required to carry out the oxygen implantation step is significantly reduced compared with the effectively one working day's time (8–16 hours) required for the method described by the authors of the article.

As pointed out previously, an oxygen dose on the order of $1 \times 10^{18}$ O+ cm$^{-2}$ is necessary to form a stoichiometric buried oxide layer, and an automatic by product of this implant is the requisite oxygen doping in the vicinity of the silicon layer 14 where the polysilicon layer is to be formed. Pursuant to the present invention, this concentration is obtained by using a high-current oxygen implant step for a period of time substantially reduced compared to that of the prior art. What would otherwise be undesirable in situ annealing of the substrate (preventing the formation of the requisite precursor amorphous EFS layer), is circumvented by the pre-anneal silicon ion implantation step ("self-implant"). Auspiciously, this step requires only medium dose at room temperature and, hence, an extremely short implantation time; yet it produces the amorphous character of the oxygen-doped region of the substrate whereat the EFS layer is to be created during the subsequent annealing step. By reducing the time of manufacture to one-eighth to one-third of that of the conventional SIMOX process, the present invention offers a front-end microelectronics process that is practical and from which a high volume of SIMOX-processed substrates may be produced that incorporate an EFS layer for integrated circuit processing in a commercially viable methodology. Moreover, because of the control provided by tee medium dose silicon implant, the process of the present invention offers a figure of merit for tailoring the shielding characteristics of the EFS layer to achieve specific integrated circuit performance objectives.

It should be noted that although, in the foregoing description of a preferred embodiment of the invention, silicon ions are employed as the implant species for forming the amorphous layer, other species of ions may be employed as the amorphizing implant formed near the interface of the buried oxide layer 13 and the silicon-on-insulator layer 14. For example, moderate doses of oxygen ions, e.g. on the order of $1 \times 10^{16}$ O+cm$^{-2}$ (second oxygen implant), may be used. In addition, noble gas species, carbon, nitrogen, or certain conventionally employed silicon dopants can be implanted near the interface to form an amorphized layer. In each instance, as in the case of the silicon implant, the dosage is considerably lower than the initial oxygen implant and is carried out at room temperature for only several minutes, so that the characteristics of the amorphous region may be controlled with precision.

The oxygen-doped polycrystalline EFS layer is of direct application to low-voltage CMOS/SOI VLSI, as well as to radiation-hardened CMOS and bipolar. For example, CMOS devices fabricated in the surface silicon layer are isolated from the back-gate while a significant reduction in back-channel leakage current should result from negligible carrier mobility in SIPOS material near the buried interface.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacturing a semiconductor device comprisng the steps of:
   (a) introducing first impurities into a semiconductor substrate and forming thereby a buried layer of material made of a combination of the material of said substrate and said first impurities;
   (b) introducing species into a region of said substrate adjacent to said buried layer and forming thereby an amorphous layer doped with said first impurities; and
   (c) heating the substrate resulting from step (b) sufficient to cause the formation of a polycrystalline layer adjacent to said buried layer.

2. A method according to claim 1, further including the step of (d) forming at least one semiconductor device component in that portion of said substrate which is separated from said buried layer by said polycrystalline layer therebetween.

3. A method according to claim 1, wherein step (b) comprises introducing species of the material of said semiconductor substrate into the region of said substrate adjacent to said buried layer and forming thereby an amorphous layer doped with said first impurities, and step (c) comprises heating the substrate resulting from step (b) sufficient to cause the formation of a polycrystalline layer of the material of said substrate ad]acent to said buried layer.

4. A method according to claim 3, wherein said substrate comprises a silicon substrate and wherein said first impurities are comprised of oxygen.

5. A method according to claim 4, wherein step (a) comprises implanting oxygen ions into said silicon substrate so as to form a buried layer of silicon dioxide.

6. A method according to claim 5, wherein step (b) comprised implanting silicon ions into said silicon substrate so as to form an oxygen-doped amorphous silicon precursor layer contiguous with said buried layer of silicon dioxide.

7. A method according to claim 6, wherein step (a) comprised implanting oxygen ions into said silicon substrate at an implant dose rate sufficient to heat said substrate to a temperature that effectively prevents the formation of an oxygen-doped amorphous silicon layer during the implantation of said oxygen ions.

8. A method according to claim 6, wherein step (a) comprises implanting oxygen ions into said silicon substrate to achieve a dosage in a range from $1.0 \times 10^{18}$ to $2.4 \times 10^{18}$ O+ cm$^{-2}$.

9. A method according to claim 7, wherein step (a) comprises implanting oxygen ions into said silicon substrate at an implant dose rate sufficient to heat said substrate to a temperature in excess of 400° C.

10. A method according to claim 8, wherein step (b) comprises implanting silicon ions into said silicon substrate to achieve a dosage greater than or equal to $0.5 \times 10^{15}$ Si+ cm$^{-2}$ at room temperature.

11. A method according to claim 10, wherein step (c) comprises heating said substrate to a temperature in a range from 1,150°–1,250° C. for a period of time of the order of 3.0 hours.

12. In a separation by implantation of oxygen (SIMOX) process of forming a semiconductor device wherein an oxygen-implanted buried silicon dioxide layer provides dielectric isolation between a first monocrystalline silicon layer in which semiconductor circuit devices are to be formed and a second underlying monocrystalline silicon support substrate, an improved method of forming an oxygen-doped amorphous silicon precursor layer EFS in said first monocrystalline silicon layer contiguous with said oxygen-implanted buried silicon dioxide layer from which an electric field shielding polysilicon layer may be formed during subsequent annealing of said substrate comprising the step of:

(a) implanting silicon ions into a portion of said first silicon layer contiguous with said oxygen implanted buried silicon dioxide layer and creating thereby said oxygen-doped amorphous silicon precursor layer.

13. An improved method according to claim 12, wherein step (a) comprises implanting silicon ions to provide an implanted dosage equal to or greater than $0.5 \times 10^{15}$ Si+ cm$^{-2}$ at room temperature.

14. An improved method according to claim 12, wherein said oxygen-implanted buried silicon dioxide layer has been formed by implanting oxygen ions into said silicon substrate at an implant dose rate sufficient to heat said substrate to a temperature that effectively prevents the formation of an oxygen-doped amorphous silicon layer during the implantation of said oxygen ions.

15. An improved method according to claim 14, wherein said oxygen-implanted buried silicon dioxide layer has been formed by implanting oxygen ions into said silicon substrate at an implant dose rate sufficient to heat said substrate to a temperature in excess of 400° C.

16. An improved method according to claim 15, wherein said dosage of oxygen ions implanted into said silicon substrate lies in a range of $1.0 \times 10^{18}$ to $2.4 \times 10^{18}$ O+ cm$^{-2}$.

17. An improved method according to claim 16, wherein said subsequent annealing step comprises heating said substrate to a temperature in a range of 1,150°–1,250° C. for a period of time of the order of 3.0 hours.

* * * * *